(12) United States Patent
Nguyen et al.

(10) Patent No.: US 7,485,582 B2
(45) Date of Patent: Feb. 3, 2009

(54) HARDMASK FOR IMPROVED RELIABILITY OF SILICON BASED DIELECTRICS

(75) Inventors: Son Van Nguyen, Yorktown Heights, NY (US); Michael Lane, Cortlandt Manor, NY (US); Stephen M. Gates, Ossining, NY (US); Xiao H. Liu, Croton on Hudson, NY (US); Vincent J. McGahay, Poughkeepsie, NY (US); Sanjay C. Mehta, Poughkeepsie, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/016,594

(22) Filed: Jan. 18, 2008

(65) Prior Publication Data
US 2008/0132055 A1 Jun. 5, 2008

Related U.S. Application Data

(62) Division of application No. 10/981,233, filed on Nov. 4, 2004, now Pat. No. 7,335,980.

(51) Int. Cl.
*H01L 21/44* (2006.01)
(52) U.S. Cl. ............ 438/736; 438/673; 438/736; 438/FOR. 211; 257/E21.246
(58) Field of Classification Search ............... 438/623, 438/736, FOR. 211; 257/E21.246
See application file for complete search history.

(56) References Cited

U.S. PATENT DOCUMENTS

| 5,481,135 A | 1/1996 | Chandra et al. |
|---|---|---|
| 6,737,727 B2 | 5/2004 | Gates et al. |
| 6,740,539 B2 | 5/2004 | Conti et al. |
| 2004/0203223 A1 | 10/2004 | Guo et al. |

*Primary Examiner*—Thanh V Pham
(74) *Attorney, Agent, or Firm*—Scully, Scott, Murphy & Presser, P.C.; Robert M. Trepp, Esq.

(57) ABSTRACT

The present invention provides a hardmask that is located on a surface of a low k dielectric material having at least one conductive feature embedded therein. The hardmask includes a lower region of a hermetic oxide material located adjacent to the low k dielectric material and an upper region comprising atoms of Si, C and H located above the hermetic oxide material. The present invention also provides a method of fabricating the inventive hardmask as well as a method to form an interconnect structure containing the same.

13 Claims, 7 Drawing Sheets

US 7,485,582 B2

HARDMASK FOR IMPROVED RELIABILITY OF SILICON BASED DIELECTRICS

RELATED APPLICATION

This application is a divisional of U.S. patent application Ser. No. 10/981,233, filed Nov. 4, 2004.

FIELD OF THE INVENTION

The present invention generally relates to integrated circuits (ICs), and more particularly to silicon based dielectrics using interconnect structures, including multilevel interconnect structures fabricated by damascene methods, in which the dielectric is a low k dielectric having a dielectric constant of about 3.0 or less. The present invention describes improved reliability of silicon based dielectrics as well as interconnect structures containing metal wiring such as copper within these low k dielectrics, the structures are improved by introducing a dense, graded hardmask on top of each of the silicon based dielectrics. The present invention also describes a method to make the inventive hardmask structure as well as a method to use in the inventive hardmask in an interconnect structure.

BACKGROUND OF THE INVENTION

Generally, semiconductor devices include a plurality of circuits which form an IC fabricated on a single crystal silicon substrate. A complex network of signal paths will normally be routed to connect the circuit elements distributed on the surface of the substrate. Efficient routing of these signals across the device requires formation of multilevel or multilayered interconnect schemes, such as, for example, dual damascene wiring structures based on copper. Copper based interconnect structures are desirable over previously used Al interconnects due to their efficacy in providing high speed signal transmission between large numbers of transistors on a complex semiconductor chip.

Within a typical interconnect structure, metal vias run perpendicular to the silicon substrate and metal lines run parallel to the silicon substrate. Further enhancement of the signal speed and reduction of signals in adjacent metal lines (known as "crosstalk") are achieved in new IC product chips by embedding the metal lines and vias in a low k dielectric having a dielectric constant of about 3.0 or less. These low k dielectrics are sometimes referred to as ultralow k (ULK) dielectrics.

Presently, interconnect structures formed on an IC chip consist of at least about 2 to about 10 wiring levels. In one class of prior art interconnect structures, the structures are formed in a low dielectric constant (k) material having a dielectric constant of about 3.0 or less. However, reliability problems are associated with these prior art structures. During integration, reliability stress, or extended use, a chip interconnect structure made in a low k dielectric may fail or degrade due to poor adhesion, moisture uptake, and various stress migration between the metal liner/metal and the low k dielectric. This poor quality and reliability results from the defects in the low k dielectric film and the metal liner, allowing metal or metal ions, e.g., Cu or Cu ions, to penetrate the dielectric allowing oxidizing species such as $H_2O$ or $O_2$ to interact with the metal. The problems become serve with the introduction of porous low k films where nanopores are present in the film to reduce the dielectric constant of the same.

The mechanical properties of these porous low k films are less robust as compared to a conventional $SiO_2$ dielectric for subsequent device fabrication and packaging. As a result, significant interlevel dielectric film cracking may occur as the low k dielectric film becomes more porous, especially when it is exposed to moisture. Moreover, the effective cohesive strength of porous low k films is reduced, as the dielectric film is prone to stress cracking.

In an integrated structure and when a blanket dielectric layer is deposited over an underlying patterned layer, the driving force for cracking increases due to the thermal mismatch between the metal interconnect lines and the dielectric. As a result, cracking may occur in the overlying blanket dielectric film even though the film itself does not contain enough driving force to induce cracking.

In view of the above, there is a need to prevent moisture absorption, reduce cracking and improve mechanical properties of low k dielectric films and to enhance the reliability of the metal/low k dielectric interconnect faces by reducing the defect of the low k dielectrics that are caused by open pores and result in easy moisture adsorption during subsequent processing steps, poor adhesion between interfaces, increased cracking force and ultimately failed device reliability.

SUMMARY OF THE INVENTION

The present invention provides a back-end-of-the-line (BEOL) interconnect structure of either the dual or single damascene type in a low k dielectric (k of about 3.0 or less, preferably less than about 2.8, and more preferably less than about 2.5) with improved reliability. The inventive BEOL interconnect structures formed in the low k dielectric are very stable and have reliable electrical characteristics, such as leakage, metal resistance and capacitance, during field operation or reliability stress as compared with conventional BEOL interconnect structures formed in low k dielectrics. Additionally, the inventive BEOL interconnect structure does not exhibit delamination or moisture adsorption that eventually would lead to poor dielectric breakdown.

The inventive BEOL interconnect structure having the characteristics mentioned above comprises an improved hardmask that is located on top of the low k dielectric in which the metal lines and/or vias are formed. The hardmask of the present invention has a graded composition, in terms of the C content, including an upper region comprising atoms of Si, C, H and optionally o and/or N and a lower region comprising a hermetic oxide material in which the C content is less than about 10 atomic %. The lower region of the inventive hardmask is located on a surface of the low k dielectric material. The lower hermetic oxide layer of the inventive hardmask is thin, on the order of about 0.5 to about 10 nm, and serves as a moisture barrier. The upper region comprising atoms of Si, C, H and optionally O and/or N serves as a chemical mechanical polishing (CMP) etch stop layer. The thickness of the upper region of the inventive hardmask is from about 5 to about 100 nm.

Specifically, and in broad terms, the inventive interconnect structure comprises:

a low k dielectric material having a dielectric constant of about 3.0 or less and having at least one conductive feature embedded therein; and a hardmask located on a surface of said low k dielectric material, said hardmask comprising a lower region of a hermetic oxide material located adjacent to said low k dielectric material and an upper region comprising atoms of Si, C and H located above said hermetic oxide material.

In some embodiments of the present invention, the upper region may farther comprise O, N or a mixture of O and N.

In addition to the BEOL interconnect structure mentioned above, the present invention also provides a method for fabricating the hardmask which can be integrated within BEOL processing to provide the inventive interconnect structure described above. Specifically, the method of the present invention comprises the steps of:

forming a low k dielectric material having a dielectric constant of about 3.0 or less on a surface of a substrate;

forming a hardmask on a surface of said low k dielectric material, said hardmask comprising a lower region of a hermetic oxide material located adjacent to said low k dielectric material and an upper region comprising atoms of Si, C and H located above said hermetic oxide material;

providing at least one opening in said hardmask and a portion of said low k dielectric material;

forming a liner within said opening; and filling said opening with a conductive material.

DETAILED DESCRIPTION OF THE INVENTION

Figure 1A:
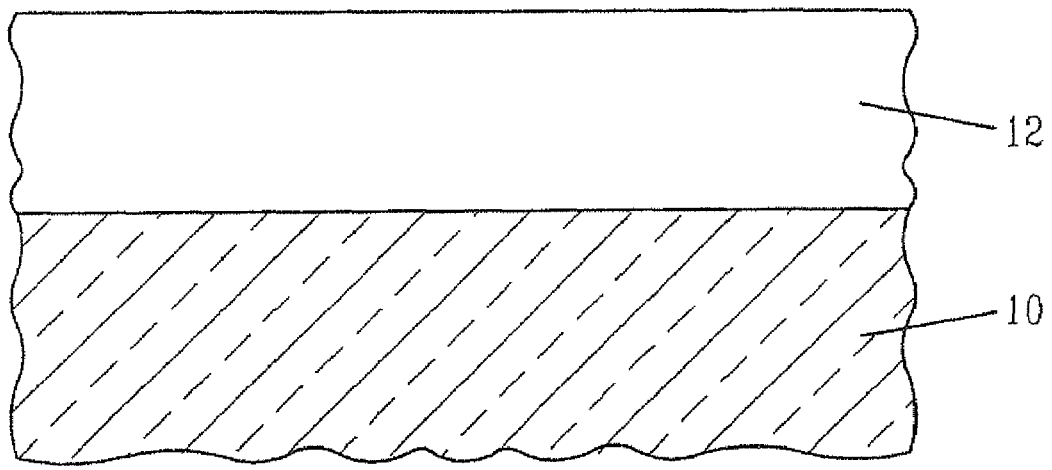
FIGS. 1A-1E are pictorial representations (through cross-sectional views) illustrating the basic processing steps that are employed in the present invention for fabricating a BEOL interconnect structure having improved reliability.

The present invention, which provides a BEOL interconnect structure having improved reliability as well as a method of fabricating the same, will now be described in greater detail by referring to the drawings that accompany the present application. It is noted that the drawings depicted in FIGS. 1A-1E, which illustrate the basic processing steps of the present invention, are provided for illustrative purposes and thus they are not drawn to scale.

Reference is made first to FIG. 1A which illustrates a structure that is provided after forming a low k dielectric material 12 on a surface of a substrate 10. The term "substrate" when used in conjunction with substrate 10 includes, a semiconducting material, an insulating material, a conductive material or any combination thereof, including multilayered structures. Thus, for example, substrate 10 can be a semiconducting material such as Si, SiGe, SiGeC, SiC, GaAs, InAs, InP and other III/V or II/VI compound semiconductors. The semiconductor substrate 10 can also include a layered substrate such as, for example, Si/SiGe, Si/SiC, silicon-on-insulators (SOIs) or silicon germanium-on-insulators (SGOIs).

When substrate 10 is an insulating material, the insulating material can be an organic insulator, an inorganic insulator or a combination thereof including multilayers. When the substrate 10 is a conductive material, the substrate 10 may include, for example, polySi, an elemental metal, alloys of elemental metals, a metal silicide, a metal nitride and combinations thereof, including multilayers.

In some embodiments, the substrate 10 includes a combination of a semiconducting material and an insulating material, a combination of a semiconducting material and a conductive material or a combination of a semiconducting material, an insulating material and a conductive material.

When the substrate 10 comprises a semiconductor material, one or more semiconductor devices such as complementary metal oxide semiconductor (CMOS) devices can be fabricated thereon. For clarity, the one or more semiconductor devices are not shown in the drawings of the present application.

The low k dielectric material 12 can comprise any dielectric material having a dielectric constant of about 3.0 or less. Preferably, the low k dielectric material 12 has a dielectric constant of less than about 2.8, with a dielectric constant of less than about 2.5 being more highly preferred. The low k dielectric material 12 can be porous or nonporous. When porous dielectric films are employed, the dielectric constant thereof is less than the nonporous version of the same dielectric film. Preferably, the low k dielectric material 12 is a porous material.

Examples of low k dielectrics that can be employed in the present invention include, but are not limited to: silicon-containing materials such as a composition of Si, C, O and H (SiCOH) also called C doped oxide (CDO) or organosilicate glass (OSG). Another example of a low k dielectric is a thermosetting polyarylene ether. The term "polyarylene" is used herein to denote aryl moieties or inertly substituted aryl moieties which are linked together by bonds, fused rings, or inert linking groups such as oxygen, sulfur, sulfone, sulfoxide, carbonyl, etc.

The low k dielectric film 12 is typically deposited using plasma enhanced chemical vapor deposition (PECVD). In addition to PECVD, the present invention also contemplates that the low k dielectric film 12 can be formed utilizing chemical vapor deposition (CVD), high-density plasma (HDP) deposition, pulsed PECVD, spin-on application, or other related methods. The thickness of the low k dielectric film 12 deposited may vary; typical ranges for the deposited low k dielectric film 12 are from about 50 nm to about 1 µm, with a thickness from 100 to about 500 nm being more typical.

Typically, the low k dielectric film 12 is a SiCOH dielectric that is deposited using the processing techniques disclosed in co-assigned U.S. Pat. Nos. 6,147,009, 6,312,793, 6,441,491, 6,437,443, 6,441,491, 6,541,398, 6,479,110 B2, and 6,497,963, the contents of which are incorporated herein by reference.

Specifically, the SiCOH dielectric film is formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming a SiCOH dielectric material. The present invention yet further provides for mixing the first precursor with an oxidizing agent such as $O_2$, $CO_2$ or a combination thereof, thereby stabilizing the reactants in the reactor and improving the uniformity of the low k dielectric film 12 deposited on the substrate 10.

In addition to the first precursor, a second precursor (gas, liquid or vapor) comprising atoms of C, H, and optionally O, F and N can be used. Optionally, a third precursor (gas, liquid or gas) comprising Ge may also be used.

Preferably, the first precursor is selected from organic molecules with ring structures comprising SiCOH components such as 1,3,5,7-tetramethylcyclotetrasiloxane ("TMCTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), and related cyclic and non-cyclic silanes, siloxanes and the like.

The second precursor that may be used in forming a SiCOH low k dielectric is a hydrocarbon molecule. Although any hydrocarbon molecule such as, for example, ethylene, may be used, preferably the second precursor is selected from the group consisting of hydrocarbon molecules with ring structures, preferably with more than one ring present in the molecule or with branched chains attached to the ring. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H1_8O$"). Also useful are molecules containing branched tertiary butyl (t-butyl) and isopropyl (i-propyl) groups attached to a hydrocarbon ring; the ring may be saturated or unsaturated (containing C—C double bonds). The third precursor may be formed from germane hydride or any other reactant comprising a source Ge.

In a preferred embodiment of the present invention, the SiCOH dielectric film, which is used as the low k dielectric 12, may be deposited using a method the includes the step of providing a parallel plate reactor, which has a conductive area of a substrate chuck between about 85 $cm^2$ and about 750 $cm^2$, and a gap between the substrate and a top electrode between about 1 cm and about 12 cm. A high frequency RF power is applied to one of the electrodes at a frequency between about 0.45 MHz and about 200 MHz. Optionally, an additional low frequency power can be applied to one of the electrodes.

The conditions used for the deposition step may vary depending on the desired final dielectric constant of the SiCOH dielectric film. Broadly, the conditions used for providing a stable dielectric material comprising elements of Si, C, O and H that has a dielectric constant of about 2.8 or less include: setting the substrate temperature at between about 200° C. and about 425° C.; setting the high frequency RF power density at between about 0.1 W/cm and about 2.5 $W/cm^2$; setting the first liquid precursor flow rate at between about 100 mg/min and about 5000 mg/min, optionally setting the second liquid precursor flow rate at between about 50 mg/min to about 10,000 mg/min; optionally setting the third liquid precursor flow rate at between about 25 mg/min to about 4000 mg/min; optionally setting the inert carrier gases such as helium (and/or argon) flow rate at between about 50 seem to about 5000 seem; setting the reactor pressure at a pressure between about 1000 mTorr and about 7000 mTorr; and setting the high frequency RF power between about 75 W and about 1000 W. Optionally, a low frequency power may be added to the plasma between about 30 W and about 400 W. When the conductive area of the substrate chuck is changed by a factor of X, the RF power applied to the substrate chuck is also changed by a factor of X.

When an oxidizing agent is employed in the present invention, it is flown into the PECVD reactor at a flow rate between about 10 sccm to about 1000 sccm.

While liquid precursors are used in the above example, it is known in the art that the organosilicon gas phase precursors (such as trimethylsilane) can also be used for the deposition.

A porogen can be included during the deposition of the low k dielectric film 12 that causes subsequent pore formation within the film 12 during a subsequent curing step. In the present invention, the subsequent curing can be achieved utilizing one of the treatment steps described herein below. The curing of the low k dielectric film 12 can be done prior to deposition of the hardmask 14, or after deposition of the hardmask 14. Preferably, the low k dielectric film 12 and the hardmask 14 are treated at the same time.

In a preferred embodiment of the present invention, the low k dielectric film 12 formed at this point of the present invention contains a matrix of a hydrogenated oxidized silicon carbon material (SiCOH) comprising atoms of Si, C, O and H in a covalently bonded tri-dimensional network and having a dielectric constant of not more than about 2.8. The tri-bonded network may include a covalently bonded tri-dimensional ring structure comprising Si—O, Si—C, Si—H, C—H and C—C bonds.

The low k dielectric film 12 may comprise F and N and may optionally have the Si atoms partially substituted by Ge atoms. The low k dielectric film 12 may contain molecular scale voids (i.e., nanometer-sized pores) of between about 0.3 to about 50 nanometers in diameter, and most preferably between about 0.4 and about 10 nanometers in diameter, further reducing the dielectric constant of the film 12 to values below about 2.0. The nanometer-sized pores of the low k dielectric film 12 occupy a volume of between about 0.5% and about 50% of a volume of the material.

When the low k dielectric film 12 is a SiCOH dielectric, it typically comprises between about 5 and about 40 atomic percent of Si; between about 5 and about 45 atomic percent of C; between 0 and about 50 atomic percent of O; and between about 10 and about 55 atomic percent of H.

Figure 1B:
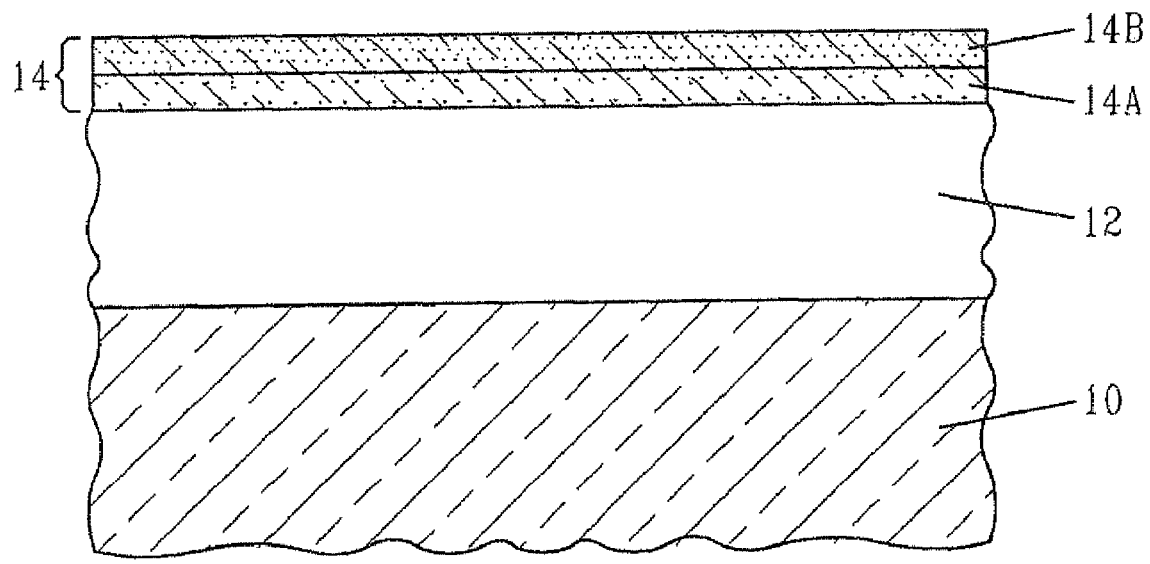

Next, and as shown in FIG. 1B, a hardmask 14, in accordance with the present invention, is formed on top of the low k dielectric film 12. As shown, the inventive hardmask 14 includes a lower region 14A and an upper region 14B. The lower region 14A of the inventive hardmask 14 has a surface that is positioned on the surface of the low k dielectric 12.

The lower region 14A of the hardmask 14 comprises a hermetic oxide material which includes less than about 10 atomic percent (%) C. More typically, the lower region 14A comprises less than about 5 atomic % C. It is noted that the C content in the lower region 14A that is in close proximity to the low k dielectric 12 is lower than the other areas within the hardmask 14. Hence, the inventive hardmask 14 has a graded C content which is lowest in proximity to the low k dielectric 12 and increases the further one gets from the upper surface of the low k dielectric 12.

The term "hermetic" is used herein to denote that the lower region is a region within the hardmask 14 that is substantially impervious to external influences such as air or moisture providing a built in sealing layer that prevents air or moisture from penetrating into the underlying low k dielectric film 12. That is, the lower region 14A is a barrier region which prevents contaminants such as air or moisture from entering into the low k dielectric 12. The lower region 14A of the inventive hardmask 14 is a thin region having a thickness on the order of about 0.5 to about 10 mm. More typically, the thickness of the lower region 14A has a thickness from about 1 to about 5 nm.

The upper region 14B of the inventive hardmask 14, which comprises atoms of Si, C, H and optionally O, N, or a mixture of O and N, serves as a chemical mechanical polishing (CMP) etch stop layer. The thickness of the upper region 14B of the inventive hardmask 14 is from about 5 to about 100 nm, with a thickness from about 10 to about 50 nm being more typical.

Typically, the upper region 14B of the inventive hardmask 14 comprises from about 10 to about 80 atomic % C, from about 10 to about 80 atomic % Si, and from about 5 to about 40 atomic % H. More typically, the upper region 14B comprises from about 30 to about 60 atomic % C, from about 30 to about 60 atomic % Si, and from about 10 to about 30 atomic % H. When O is present in the upper region, it typically is present in an amount from about 5 to about 40 atomic %, with an amount from about 10 to about 20 atomic % being even more typical. When N is present in the upper region, it typically is present in an amount from about 5 to about 40 atomic %, with an amount from about 10 to about 30 atomic % being even more typical.

The hardmask 14 is a dense layer typically having a density from about 1.0 to about 1.9 gm/cm$^3$ (the density of the lower region 14A is slightly greater than that of the overall hardmask 14; a typical range is from about 1.2 to about 2.3 gm/cm$^3$) and the dielectric constant thereof is typically on the same order as that of the low k dielectric film 12. The hardmask 14 (including the lower region 14A and the upper region 14B) has a total thickness from about 5 to about 100 nm, with a total thickness from about 10 to about 50 nm being more typical. The hardmask 14 provides high moisture resistance as well as good adhesion and CMP barrier properties to the interconnect structure.

The dense, graded hardmask 14 is substantially defect free meaning that it does not contain pinholes or micro-channels therein. The presence of pinholes and micro-channels within the hardmask could lead to moisture and air penetration into the underlying low k dielectric 12.

The hardmask 14 is formed by utilizing a deposition process including, for example, high density plasma (HPD) deposition, downstream HPD deposition, electron cyclotron resonance assisted PECVD, plasma enhanced atomic layer deposition (PE ALD), ALD or other related deposition processes.

The inventive hardmask 14 is formed by placing the substrate 10 inside a reactor chamber of a PECVD apparatus, HDP apparatus, PE ALD apparatus, ECR plasma enhanced CVD apparatus, ALD apparatus or other like apparatuses. Within the reactor chamber, the low k dielectric 12 is applied and thereafter the hardmask 14 is formed. The formation of the low k dielectric 12 and the hardmask 14 can be performed without breaking the vacuum within the reactor chamber. Alternatively, but less preferably, the vacuum can be broken between the deposition of the low k dielectric 12 and the hardmask 14. Generally, the hardmask 14 is formed by selecting at least two precursor molecules including at least a Si or organosilane source and an oxygen source which are introduced into the reactor chamber either as single stream or as a mixture. The precursor molecules can be in the liquid or vapor form prior to being introduced into the reactor chamber but once inside the chamber a vapor or plasma thereof is formed and is used to deposit the hardmask 14 on the low k dielectric 12.

As stated above, the precursor molecules used in the present invention for forming the hardmask 14 include a Si or organosilicon source and an oxygen source. Optionally a carbon source, and/or a nitrogen source, such as ammonia, can be used in some instances as well.

The first precursor used in forming the hardmask 14 may include the same Si or organosilicon precursor as used in forming the low k dielectric 12. Thus, for example, the Si or organosilicon source used in forming the inventive hardmask 14 may comprise organic molecules with ring structures comprising SiCOH components such as 1,3,5,7-tetramethylcyclotetrasiloxane ("TMCTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), and related cyclic and non-cyclic silanes, siloxanes and the like.

The oxygen source that is used in conjunction with the first precursor mentioned in the previous paragraph includes $O_2$, $CO_2$ or a mixture thereof. In accordance with the present invention, the dense, graded hardmask 14 is formed by introducing an excess of the oxygen source into the reactor during the initial deposition. As the deposition proceeds, the flow of the oxygen source into the reactor is decreased to obtain a steady state composition. Typically, during the initial stage of hardmask 14 deposition, the flow of the oxygen source into the reactor is from about 50 to about 500 sccm, while the flow of the first precursor is from about 50 to about 2000 sccm. For liquid precursor, the flow is 100 mgm to about 4000 mgm. During the course of the deposition process, the flow of the oxygen source is decreased to a range from about 0 to about 250 sccm, while the flow rate of the first precursor is from about 100 to about 1000 sccm (or 1000 to about 2800 mgm for liquid precursor).

The optional C source that may be used in forming the hardmask 14 is a hydrocarbon molecule. Although any hydrocarbon molecule such as, for example, ethylene or methane, may be used in forming the hardmask 14, preferably the optional source is selected from the group consisting of hydrocarbon molecules with ring structures, preferably with more than one ring present in the molecule or with branched chains attached to the ring. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO(" or "$C_5H_8O$"). Also useful are molecules containing branched tertiary butyl (t-butyl) and isopropyl (i-propyl) groups attached to a hydrocarbon ring; the ring may be saturated or unsaturated (containing C=C double bonds). Typical flow rates from the optional C source used in hardmask 14 deposition are from about 100 to about 1000 sccm, with a flow rate from about 200 to about 400 sccm being even more typical.

An inert carrier such as He or Ar may be used in conjunction with sources mentioned above.

The deposition of the hardmask 14 is typically performed at low pressures (on the order of about 50 to about 8000 milliTorr, e.g., mTorr), low temperatures (on the order of less than 420° C.) and at a low RF source and bias power (less than 800 watts for a 200 mm system).

After deposition, the hardmask 14 may optionally be treated utilizing an energy source such as thermal, electron beam, plasma or optical radiation such as UV or laser. Combinations of the aforementioned energy sources can also be used in the present invention.

The thermal energy source includes any source such as, for example, a heating element or a lamp, that can heat the deposited hardmask 14 to a temperature up to 450° C. More preferably, the thermal energy source is capable of heating the hardmask 14 to a temperature from about 200° to about 450° C., with a temperature from about 350° C. to about 425° C. being even more preferred. This thermal treatment process can be carried out for various time periods, with a time period from about 0.5 minutes to about 300 minutes being typical. The thermal treatment step is typically performed in the presence of an inert gas such as He, Ar, Ne, Xe, $N_2$ or a mixture thereof. The thermal treatment step may be referred to as an anneal step in which rapid thermal anneal, furnace anneal, laser anneal or spike anneal conditions are employed.

In some embodiments, the thermal treatment step can be performed in the presence of a gas mixture containing a hydrogen source gas such as, for example, $H_2$ or a hydrocarbon. In yet other embodiments, the thermal treatment step can be performed in the presence of a gas mixture containing a very low partial pressure of $O_2$ and $H_2O$, in the range below 1000 parts per million.

The UV light treatment step is performed utilizing a source that can generate light having a wavelength from about 500 to about 150 nm, to irradiate the substrate while the wafer temperature is maintained at up to 450° C., with temperatures from 200° C.-450° C. being preferred and a temperature from 350° C. to 425° C. being even more highly preferred. Radiation with >370 nm is of insufficient energy to dissociate or activate important bonds, so the wavelength range 150-370 nm is a preferred range. Using literature data and absorbance spectra measured on as deposited films, the inventors have found that <170 nm radiation may not be favored due to degradation of the SiCOH film. Further, the energy range 310-370 nm is less useful than the range 150-310 nm, due to the relatively low energy per photon from 310-370 nm. Within the 150-310 nm range, optimum overlap with the absorbance spectrum of the as deposited film and minimum degradation of the film properties (such as hydrophobicity) may be optionally used to select a most effective region of the UV spectrum for changing the SiCOH properties.

The UV light treatment step may be performed in an inert gas, a hydrogen source gas or a gas mixture of $O_2$ and $H_2O$ using the partial pressure range mentioned above.

The electron beam treatment step is performed utilizing a source that is capable of generating a uniform electron flux over the wafer, with energies from 0.5 to 25 keV and current densities from 0.1 to 100 microAmp/cm$^2$ (preferably 1 to 5 microAmp/cm$^2$), while the wafer temperature is maintained at a temperature up to 450° C., with temperatures from 200°-450° C. being preferred, and temperature from 350° to 425° being even more highly preferred. The preferred dose of electrons used in the electron beam treatment step is from 50 to 500 microcoulombs/cm$^2$, with 100 to 300 microcoulombs/cm$^2$ range being preferred.

The electron beam treatment step may be performed in an inert gas, a hydrogen source gas or a gas mixture of $O_2$ and $H_2O$ using the partial pressure range mentioned above.

The plasma treatment step is performed utilizing a source that is capable of generating atomic hydrogen (H), and optionally $CH_3$ or other hydrocarbon radicals. Downstream plasma sources are preferred over direct plasma exposure. During plasma treatment the wafer temperature is maintained at a temperature up to 450° C., with temperatures from 200° C.-450° C. being preferred and temperatures from 350° C. to 425° C. being more highly preferred.

The plasma treatment step is performed by introducing a gas into a reactor that can generate a plasma and thereafter it is converted into a plasma. The gas that can be used for the plasma treatment includes inert gases such as Ar, N, He, Xe or Kr, with He being preferred; hydrogen or related sources of atomic hydrogen, methane, methylsilane, related sources of $CH_3$ groups, and mixtures thereof. The flow rate of the plasma treatment gas may vary depending on the reactor system being used. The chamber pressure can range anywhere from 0.05 to 20 torr, but the preferred range of pressure operation is 1 to 10 torr. The plasma treatment step occurs for a period of time, which is typically from about ½ to about 10 minutes, although longer times may be used within the invention.

An RF or microwave power source is typically used to generate the above plasma. The RE power source may operate at either a high frequency range (on the order of about 100 W or greater); a low frequency range (less than 250 W) or a combination thereof may be employed. The high frequency power density can range anywhere from 0.1 to 2.0 W/cm$^2$ but the preferred range of operation is 0.2 to 1.0 W/cm$^2$. The low frequency power density can range anywhere from 0.1 to 1.0 W/cm$^2$ but the preferred range of operation is 0.2 to 0.5 W/cm$^2$. The chosen power levels must be low enough to avoid significant sputter etching of the exposed dielectric surface (<5 nanometers removal).

In addition to the above, a deep ultra-violet (DUV) laser source can also be employed. The laser source used to treat the deposited hardmask 14 is typically an excimer laser which operates at one of several DUV wavelengths depending on the laser gas mixture. For example, a XeF laser which produces 308 nm radiation can be employed. Also, a KrF laser that produces 248 nm radiation, or a ArF laser that produces 193 nm radiation can be employed in the present invention. Excimer lasers can operate at several hundred pulses per second with pulse energies up to a Joule (J) resulting in several hundred Watt (W) output.

The laser employed in treating the as deposited hardmask 14 preferably operates under a pulse mode. The laser beam can be expanded to expose the entire sample. Alternatively, and for larger samples, the laser exposure area can be raster scanned across the sample to provide uniform dose. Using excimer laser, the fluence is limited to less than 5 mJ/cm$^2$ per pulse to ensure ablation will not occur. The short pulse duration of about 10 ns for the excimer laser can cause material ablation at fluence levels greater than 20 mJ/cm$^2$. Typically, laser fluence levels of 0.1-5 mJ/cm$^2$ per pulse are employed. The total dose can vary from 1 to 10000 Joules/cm$^2$, preferably 500-2000 J/cm$^2$. This is achieved by multiple laser pulse exposure. For example, a dose of 1000 J/cm$^2$ can be obtained using a fluence of 1 mJ/cm$^2$ for duration of $10^6$ pulses. Excimer laser normally operates at a few hundreds pulses per second. Depending of the total dosage required, the overall exposure time period for the DUV laser treatment for a several seconds to hours. A typical 500 J/cm$^2$ dose is achieved in less than 15 min using a 200 Hz laser operating at a fluence level of 3 mJ/cm$^2$ per pulse.

The treatment step mentioned above causes activation of the as deposited hardmask 14. Specifically, the above treatment step causes cross-linking in the hardmask which, in turn, causes bulk bonding. Moreover, the treatment step drives out any weak bonding structure present in the hardmask by thermal heating and photon energy which causes the hardmask to become much more stable under low thermal heating energy.

After providing the structure shown in FIG. 1B, a photoresist material (not shown) is applied to the surface of the hardmask 14 and then lithography is used to provide a pattern into the photoresist material. The pattern formed at this point is typically a via pattern. Although, a via pattern is particularly described and illustrated at this point of the present invention, a line pattern can be formed instead. Next, the via pattern is transferred into the hardmask 14, and thereafter into the low k dielectric 12 utilizing one or more etching steps. The patterned resist is typically removed after the hardmask 14 has been etched. The etching steps include a first etch that selectively removes the exposed portion of the hardmask 14 not covered by the patterned photoresist material. This first etch comprises a dry etching process such as reactive ion etching, ion beam etching or plasma etching. After the hardmask 14 has been patterned, the patterned photoresist is stripped and then a second etch is used to selectively remove the exposed portions of the low k dielectric 12.

Figure 1C:
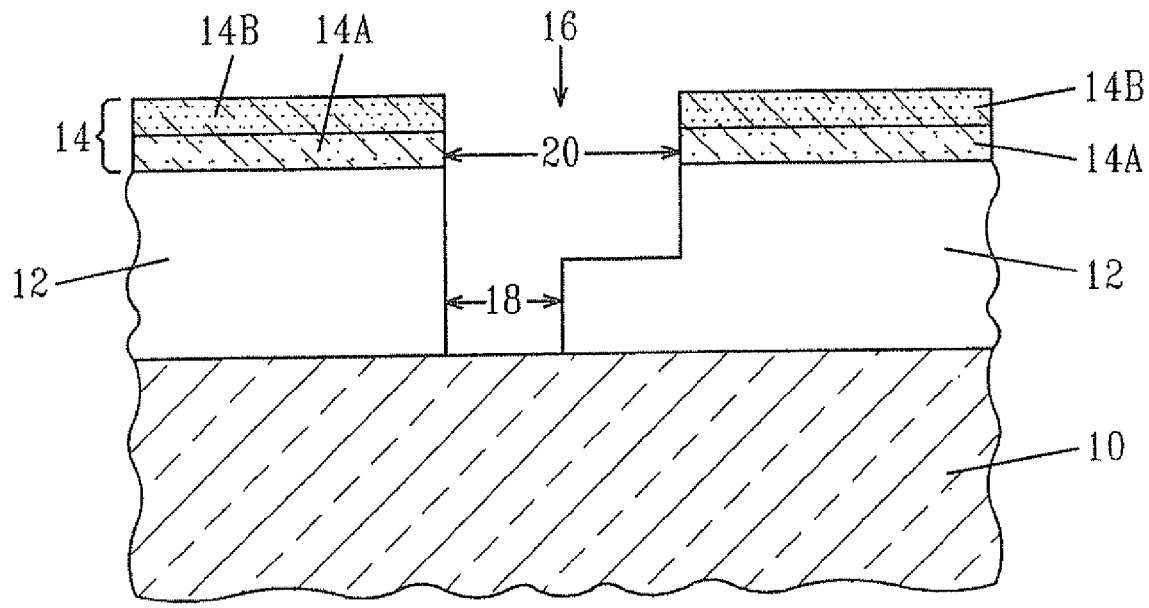

In some embodiments, the subsequent second patterning step of the present invention is not used. When employed, the second patterning step comprises applying another resist material (not shown) to the structure and then lithography is used to provide a line pattern which is transferred into the hardmask 14 and a portion of the low k dielectric 12 utilizing an etching process which includes one or more dry etching steps. The line pattern is formed into an upper portion of the low k dielectric 12. In FIG. 1C, reference numeral 16 denotes the opening that is created into the low k dielectric 12 using the above processing steps. In the embodiment illustrated, the opening 16 includes a via region 18 and a line region 20.

In some embodiments of the present invention, the line can be formed first and then the via can be formed. In yet other embodiments, only a via or line opening is formed.

Figure 1D:
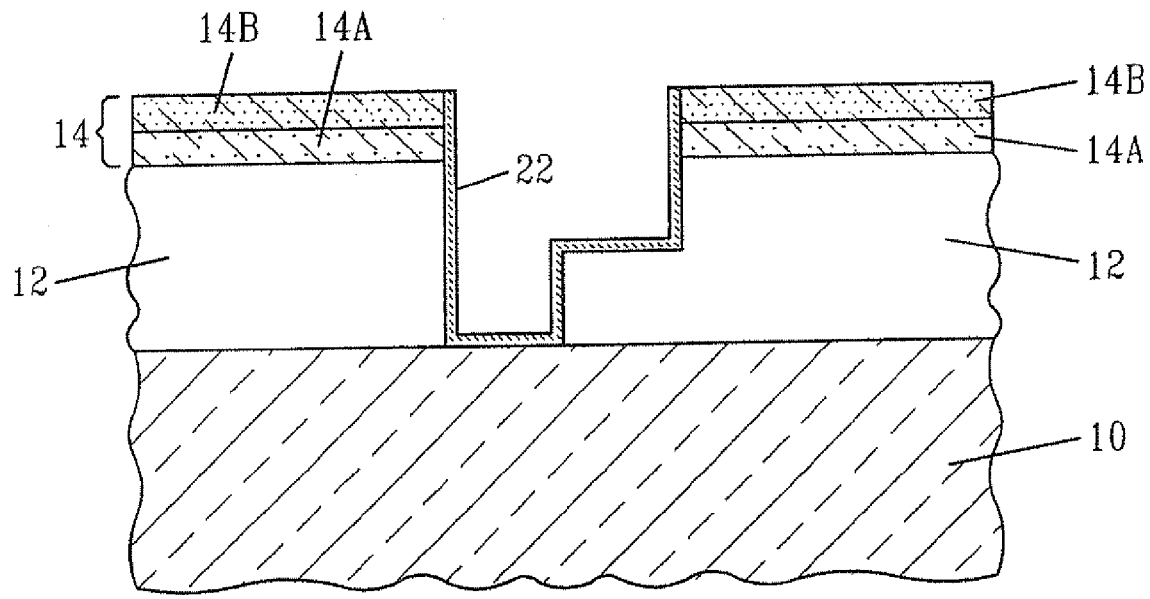

At least one liner 22 is then formed on all exposed surfaces (vertical and horizontal) within the opening 16 created above so as to provide the structure shown in FIG. 1D. The liner 22 is formed by any deposition process including, but not limited to: CVD, PECVD, sputtering, chemical solution deposition or plating. The liner 22 is comprised of any material that can serve as a barrier to prevent a conductive material from diffusing there through. Illustrative examples of such barrier materials include a refractory metal, such as Ta, Ti, W, Ru, or nitrides thereof, e.g., TaN, TiN, WN. The liner 22 may also comprise TiNSi. The thickness of the liner 22 is typically from about 5 to about 60 nm, with a thickness from about 10 to about 40 nm being more typical.

In some embodiments, not shown, it is possible to remove the liner 22 from the bottom wall of the via 20 to provide an interconnect structure having an open via bottom. When an open via bottom structure is desired, an ion bombardment or other like directional etching process is employed.

Figure 1E:
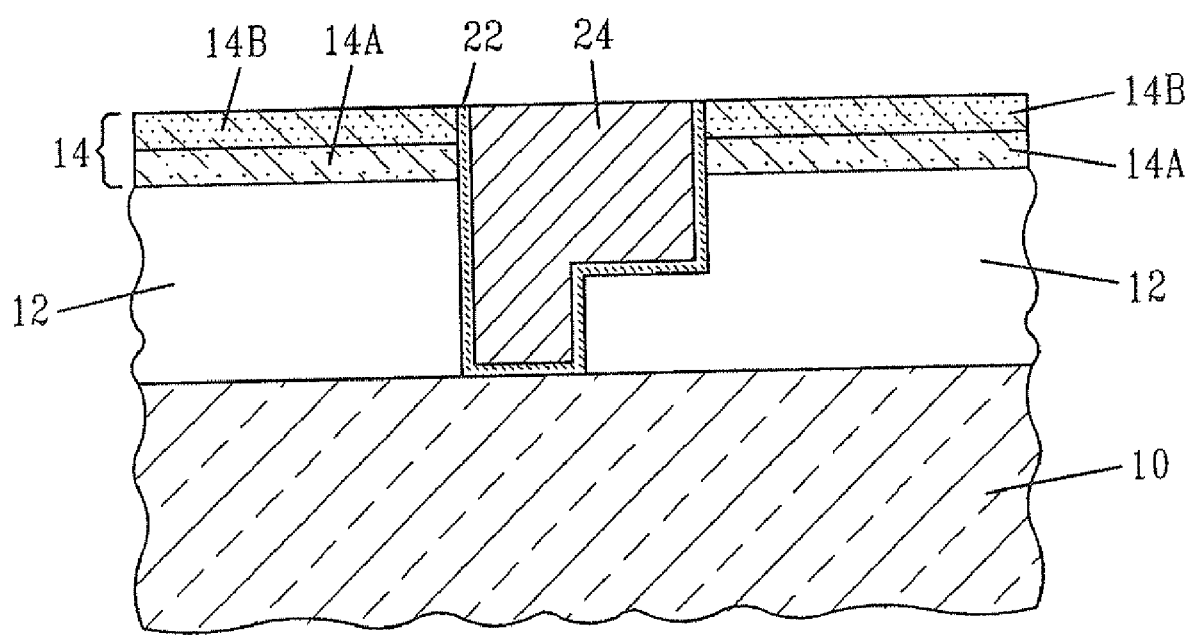

Next, and as shown in FIG. 1E, a conductive material 24 is deposited within the opening 16. The conductive material 24 comprises polySi, a conductive metal, an alloy comprising at least one conductive metal, a conductive metal silicide or combinations thereof. Preferably, the conductive material 24 is a conductive metal such as Cu, W, or Al. In one highly preferred embodiment, the conductive material 24 is comprised of Cu. The conductive material 24 is formed within the opening 16 utilizing a conventional deposition process including, but not limited to: CVD, PECVD, sputtering, chemical solution deposition or plating. After deposition, a planarization process can be employed such that the upper surface of the conductive material 24 is substantially coplanar with the upper surface of the low k dielectric 12 or, if present and not removed by the planarization step, the upper surface of the hardmask 14. In FIG. 1E, the latter embodiment is shown. The conductively filled opening can be referred to herein as a conductive feature that is embedded within the low k dielectric 12.

The above processing may be repeated any number of times to provide a multilevel interconnect structure. Although the multilevel interconnect structure is not limited to any number, current technologies has from about 2 to about 10 interconnect levels.

The following example is provided to illustrate some advantageous of the inventive hardmask 14 described above.

EXAMPLE

In this example, four different OMCATS-containing hardmasks (HMs) of the present invention were made by PECVD using the conditions in the following table.

TABLE

| | OMCATS HM 1 300 mm | OMCATS HM 2 300 mm | OMCATS HM 3 300 mm | OMCATS HM 4 200 mm* |
|---|---|---|---|---|
| OMCATS Flow (mgm) | 2000 | 2500 | 2800 | 1800 |
| $O_2$ Flow (sccm) | 0 | 160 | 220 | 0 |
| He Carrier Flow (sccm) | 1000 | 1000 | 1000 | 500 |
| Temp. (° C.) | 350 | 350 | 350 | 350 |
| Pressure (Torr) | 5 | 5 | 5 | 5 |
| Spacing (mils) | 450 | 450 | 450 | 450 |
| HF power (W) | 500 | 500 | 400 | 500 |
| LF power (W) | 0 | 150 | 60 | 75 |

Figure 2A:
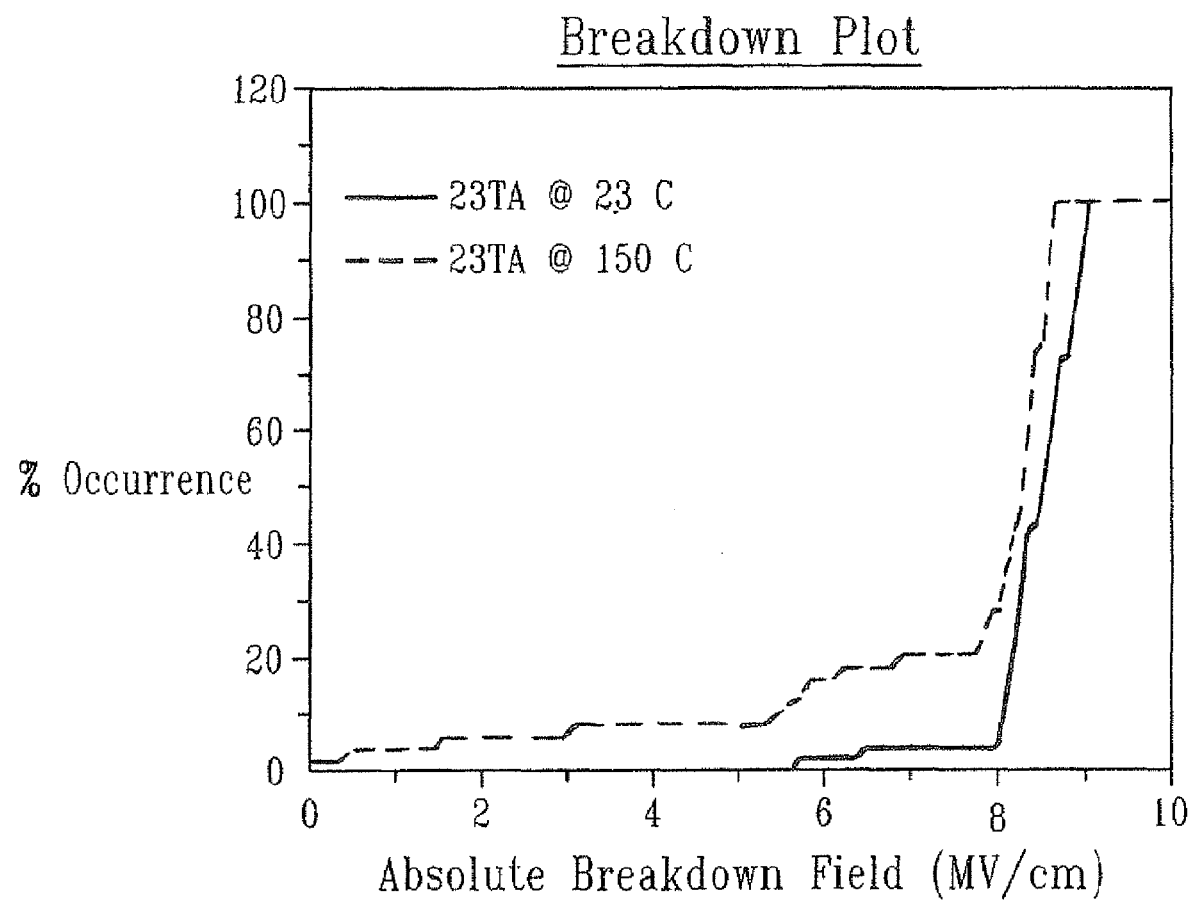
FIGS. 2A and 2B are plots showing the breakdown data and breakage data for a hardmask of the present invention that was formed from an OMCATS precursor.
Figure 2B:
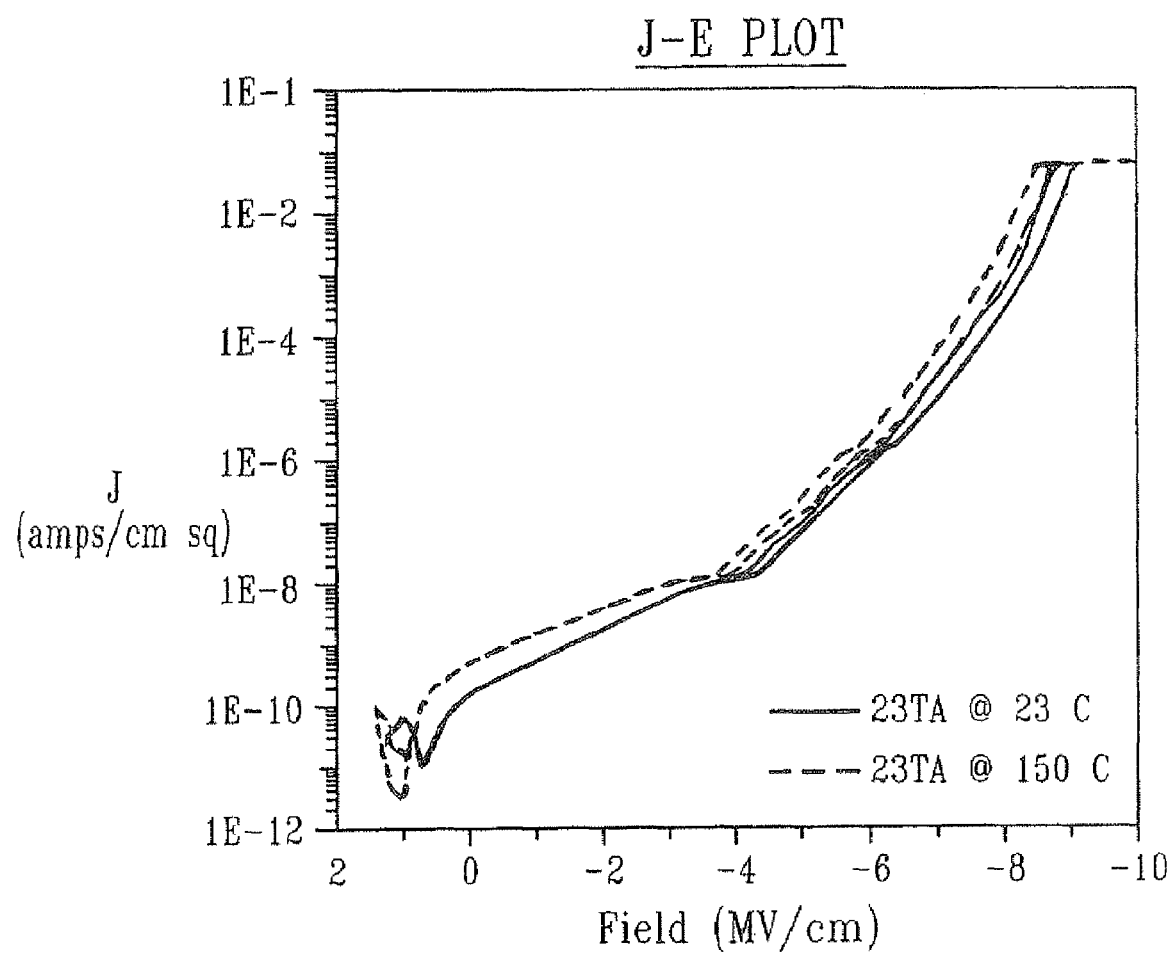

*For OMCATS HM 4 prepare in 200 mm Plasma CVD system (Column 5), typical electrical breakdown plots, breakdown plot and J-E plot are shown in FIGS. 2A and 2B. It can be seen from the plots that this film had excellent breakdown properties of 8 MV/cm and a low electrical leakage of less than $2 \times 10E-9$ A/cm² at 2MV/cm.

Figure 3:
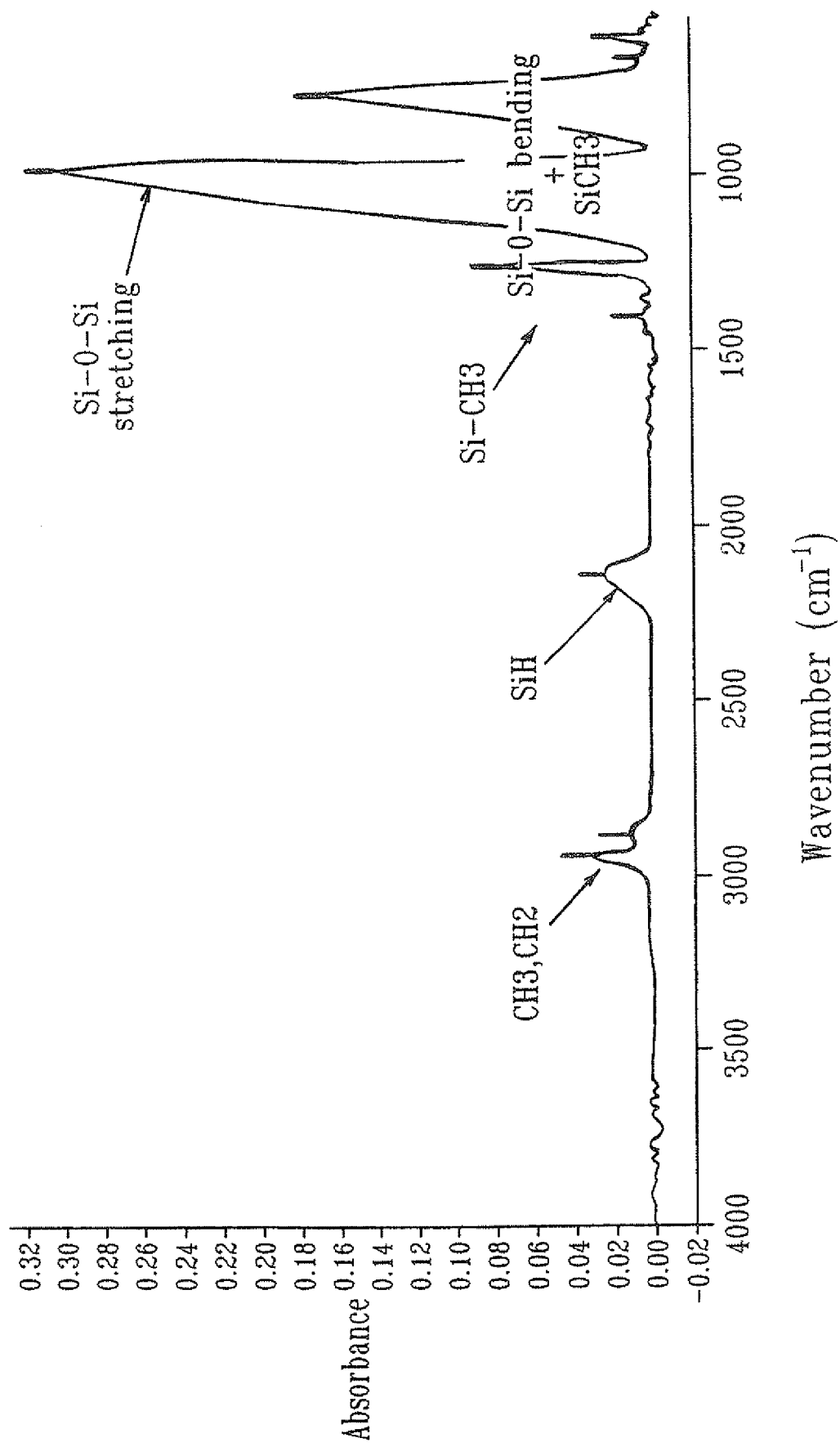
FIG. 3 is the FTIR spectra of a hardmask of the present invention that was formed from an OMCATS precursor.
Figure 4:
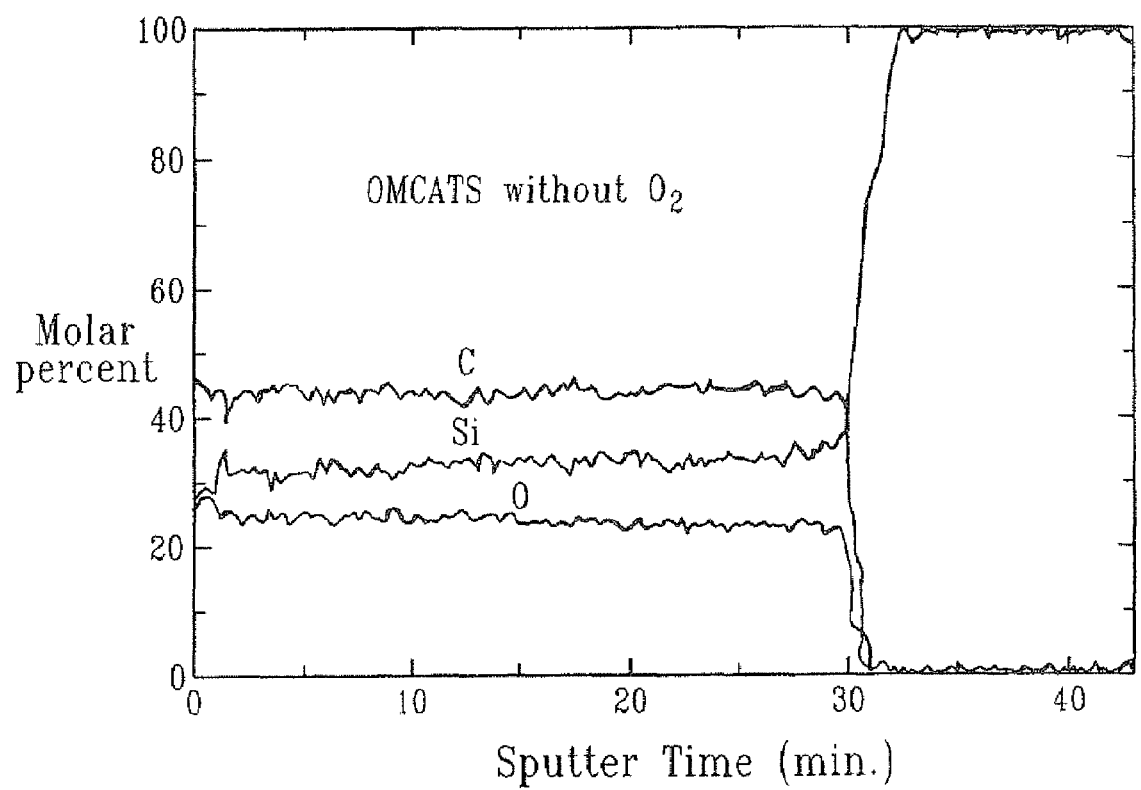
FIG. 4 is the Auger spectra of the OMCATS hardmask of the present invention.

The FTIR spectrum shown in FIG. 3 reveals a typical plasma SiCOH film structure with stable Si—O, Si—$CH_3$, Si—H and cross-linking Si—$CH_2$—Si bonding in the film. The typical Auger Profile (FIG. 4) of SiCOH film without $O_2$ precursor showed good depth profile uniformity. These results in FIGS. 2-4 showed a stable bonding structure and excellent electrical properties for the inventive hardmask. Overall, the hardmasks of the present invention had good CMP resistance properties under the described deposition process conditions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an interconnect structure comprising the steps of:
    forming a low k dielectric material having a dielectric constant of about 3.0 or less and having a first atomic concentration of carbon ranging between 5 atm % to about 45 atm % on a surface of a substrate;
    forming a hardmask on a surface of said low k dielectric material, said hardmask comprising a lower region of a hermetic oxide material having a second atomic concentration of carbon less than about 5 atm % located adjacent to said low k dielectric material and an upper region comprising atoms of Si, C and H located above said hermetic oxide material, wherein said first atomic concentration of carbon is greater than said second atomic concentration of carbon;
    providing at least one opening in said hardmask and a portion of said low k dielectric material;
    forming a liner within said at least one opening; and
    filling said at least one opening with a conductive material.

2. The method of claim 1 wherein said forming said low k dielectric material comprises plasma enhanced chemical vapor deposition (PECVD), chemical vapor deposition (CVD), high-density plasma (HDP) deposition, pulsed PECVD, or a spin-on application.

3. The method of claim 1 wherein said forming said low k dielectric material comprising a PECVD process in which at least a first precursor comprising atoms of Si, C, O, and H, and an inert carrier are introduced into a reactor.

4. The method of claim 1 wherein said forming said hardmask comprises high density plasma (HPD) deposition, downstream HPD deposition, electron cyclotron resonance assisted PECVD, plasma enhanced atomic layer deposition (PE ALD) or ALD.

5. The method of claim 1 wherein said forming said hardmask comprises a step of selecting two or more precursor molecules which are introduced into a reactor chamber either as single stream or as a mixture.

6. The method of claim 5 wherein said two or more precursor molecules comprise a Si or organosilicon source, an oxygen source, and optionally a carbon source.

7. The method of claim 6 wherein said oxygen source is supplied in excess during the initial deposition and is decreased during the remaining deposition to provide a steady state composition.

8. The method of claim 1 further comprising treating said hardmask with energy source selected from the group consisting of thermal, electron beam, plasma, UV, laser and combinations thereof.

9. The method of claim 1 wherein said forming said at least one opening comprises at least one lithographic and etching process.

10. The method of claim 1 wherein said forming at least one opening comprises forming a via opening and a line opening.

11. The method of claim 1 further comprising repeating the steps of forming said low k dielectric material, forming a hardmask, providing at least one opening, forming a liner, and filling at least one to provide a multilevel interconnect structure.

12. The method of claim 1 wherein said upper region comprising from about 10 to about 80 atomic % C.

13. A method of forming an interconnect structure comprising the steps of:

forming a low k dielectric material having a dielectric constant of about 3.0 or less and a first atomic concentration of C ranging between about 5 atomic % to about 45 atomic % on a surface of a substrate;

forming a hardmask on a surface of said low k dielectric material, said hardmask comprising a lower region of a hermetic oxide material having a second atomic concentration of C that is less than about 5 atomic %, wherein said first atomic % concentration of C is greater than said second atomic % concentration of C, and an upper region abutting said lower region of said hardmask and comprising atoms of Si, C and H and comprising from about 10 to about 80 atomic % C;

providing at least one opening in said hardmask and a portion of said low k dielectric material;

forming a liner within said at least one opening; and filling said at least one opening with a conductive material.

* * * * *